United States Patent
Ma

(10) Patent No.: US 6,814,587 B2
(45) Date of Patent: Nov. 9, 2004

(54) ELECTRICAL CONNECTOR WITH CONTACTS HAVING COOPERATING CONTACTING PORTIONS

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/443,608

(22) Filed: May 21, 2003

(65) Prior Publication Data
US 2004/0082204 A1 Apr. 29, 2004

(30) Foreign Application Priority Data
Oct. 25, 2002 (TW) .................................. 91217053 U

(51) Int. Cl.⁷ .............................................. H01R 12/22
(52) U.S. Cl. ........................................................ 439/66
(58) Field of Search .......................... 439/66, 630, 83, 439/515, 591, 862, 71, 891, 637

(56) References Cited

U.S. PATENT DOCUMENTS

| | | | |
|---|---|---|---|
| 5,676,559 A | * 10/1997 | Laub et al. | ................. 439/260 |
| 6,027,345 A | 2/2000 | McHugh et al. | |
| 6,146,152 A | 11/2000 | McHugh et al. | |
| 6,183,316 B1 | * 2/2001 | Morris | ........................ 439/862 |
| 6,293,805 B1 | * 9/2001 | Wu | .............................. 439/66 |
| 6,293,806 B1 | 9/2001 | Yu | |
| 6,345,987 B1 | * 2/2002 | Mori et al. | .................... 439/66 |
| 6,483,316 B2 | * 11/2002 | Kato et al. | ................... 324/536 |
| 6,488,513 B1 | * 12/2002 | Neidich et al. | ................ 439/66 |
| 6,604,950 B2 | * 8/2003 | Maldonado et al. | ........... 439/66 |

* cited by examiner

*Primary Examiner*—Ross Gushi
*Assistant Examiner*—Phuongchi Nguyen
(74) *Attorney, Agent, or Firm*—Wei Te Chung

(57) ABSTRACT

An electrical connector (1) includes an insulative housing (10) and a plurality of contacts (20) received in the housing. The contact defines a first contacting portion (207) in an upper position and a second contacting portion (208) in a lower position adapted to electrically connect the complementary electrical component (30) having a plurality of conductive pads (300) thereon. During the connecting course of the electrical connector and the component, the conductive pad connects to the first contacting portion in the upper position and the second contacting portion in the lower position in turn and finally connects to the second contacting portion.

4 Claims, 5 Drawing Sheets

ELECTRICAL CONNECTOR WITH CONTACTS HAVING COOPERATING CONTACTING PORTIONS

BACKGROUND OF THE INVENTION

1. Field of the Invention

The present invention relates to an electrical connector used for electrically connecting the electrical component equipped with connective pads to a printed circuit board (PCB).

2. Description of the Related Art

An electrical connector used for electrically connecting an LGA electrical component to a PCB is widely applied in the field of electronics, and a correlative article is found in *Nonlinear Analysis Helps Design LGA Connectors* (Connector Specifier, February 2001). An electrical component connecting to such an electrical connector defines a plurality of conductive pads thereon. During the course of connecting the component to the electrical connector, the component is actuated to press on the electrical connector and the conductive pads connect with contacts of the electrical connector. Examples of such an electrical connector are disclosed in U.S. Pat. Nos. 6,027,345, 6,146,152 and 6,293,806. However, when the component presses on the contacts of the electrical connector, the contacting portion of each contact moves along the moving direction of the conductive pad, and at the same time the contacting portion moves along an approximately arcuate path. Relative to the conductive pad, the contacting portion produces a displacement along a direction perpendicular to the direction of movement of the component. If the electrical component moves a long distance, the contacting portion also moves a long distance relative to the conductive pad in the direction perpendicular to the direction of movement of the component, whereupon the contacting portion is liable to move out of contact with the conductive pad. When this happens, the electrical connector does not provide reliable electrical connection between the electrical component and the PCB.

Hence, a new electrical connector having high performance that overcomes the above-mentioned problems is desired.

SUMMARY OF THE INVENTION

An object of the present invention is to provide an electrical connector that enables reliable electrical connection between the electrical component and the PCB.

To achieve the above-mentioned object, an electrical connector in accordance with a preferred embodiment of the present invention comprises an insulative housing and a plurality of contacts received in the housing. The contact defines a first contacting portion and a second contacting portion adapted to electrically connect the complementary electrical component having conductive pads. During the connecting course of the electrical connector and the component, the conductive pad connects to the first contacting portion and the second contacting portion in turn and finally connects to the second contacting portion.

Other objects, advantages and novel features of the present invention will become more apparent from the following detailed description when taken in conjunction with the accompanying drawings, in which:

DESCRIPTION OF THE PREFERRED EMBODIMENT

Figure 1:
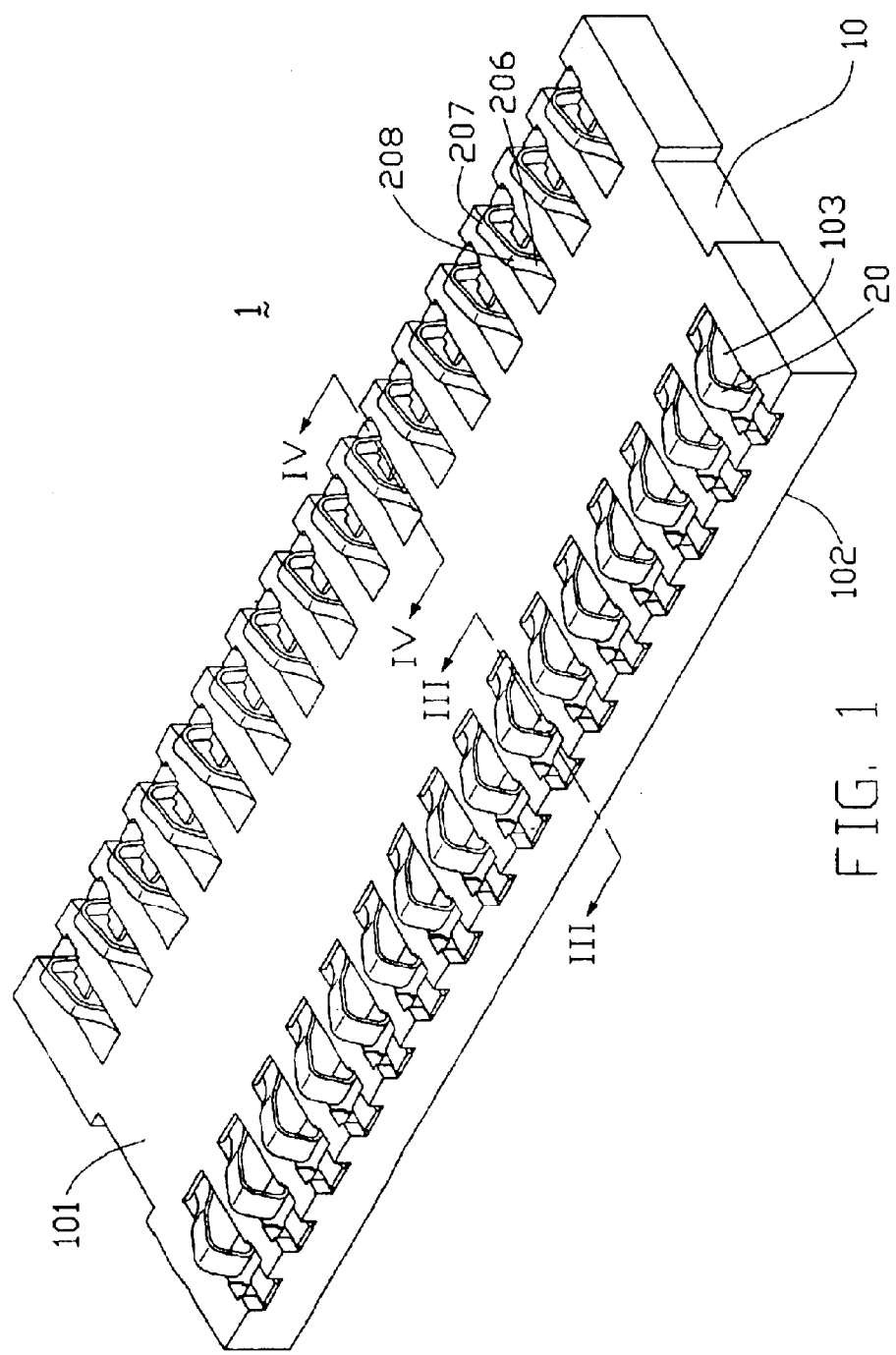
FIG. 1 is an isometric view of an electrical connector in accordance with the preferred embodiment of the present invention.
Figure 2:
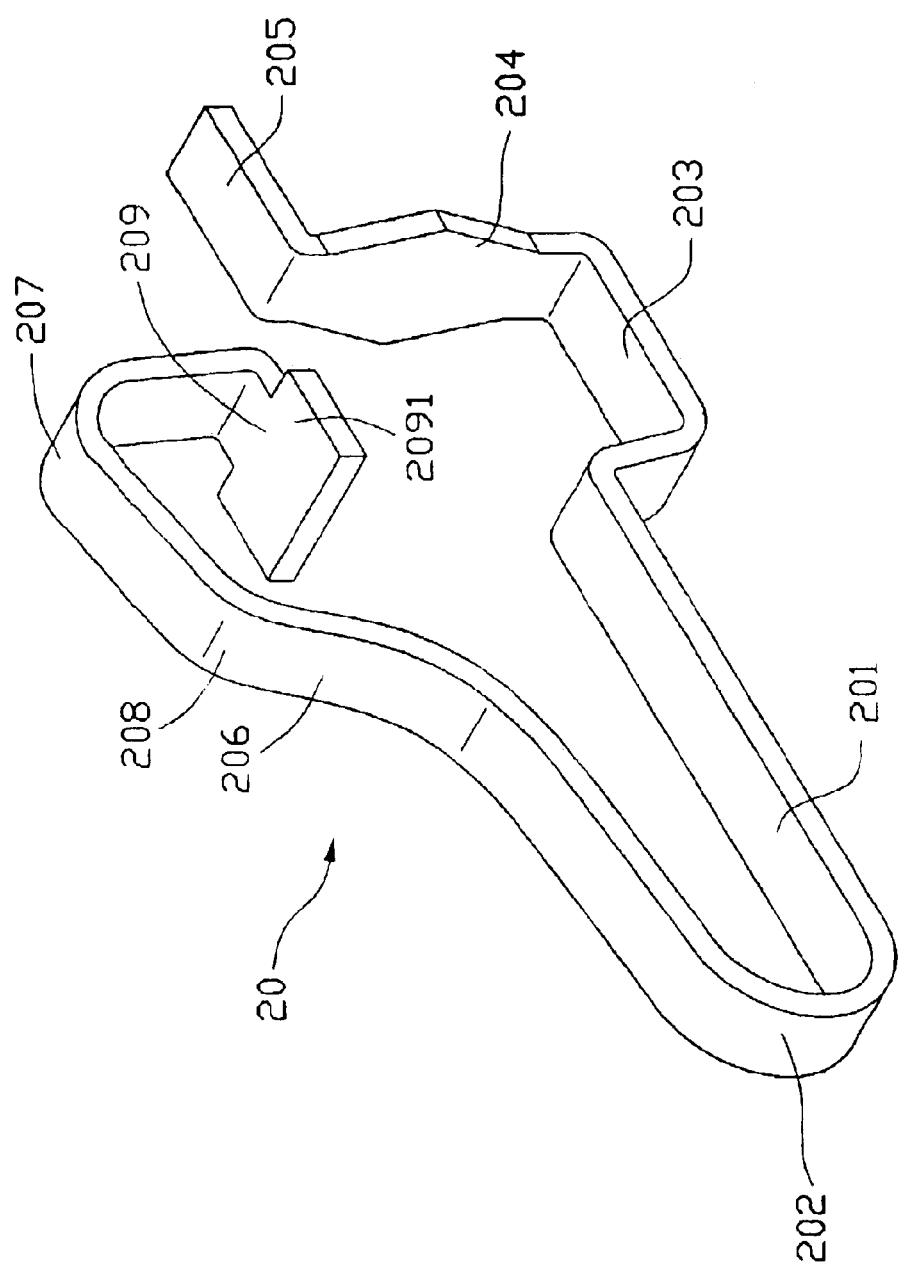
FIG. 2 is an enlarged, isometric view of one contact of the electrical connector of FIG. 1.
Figure 3:
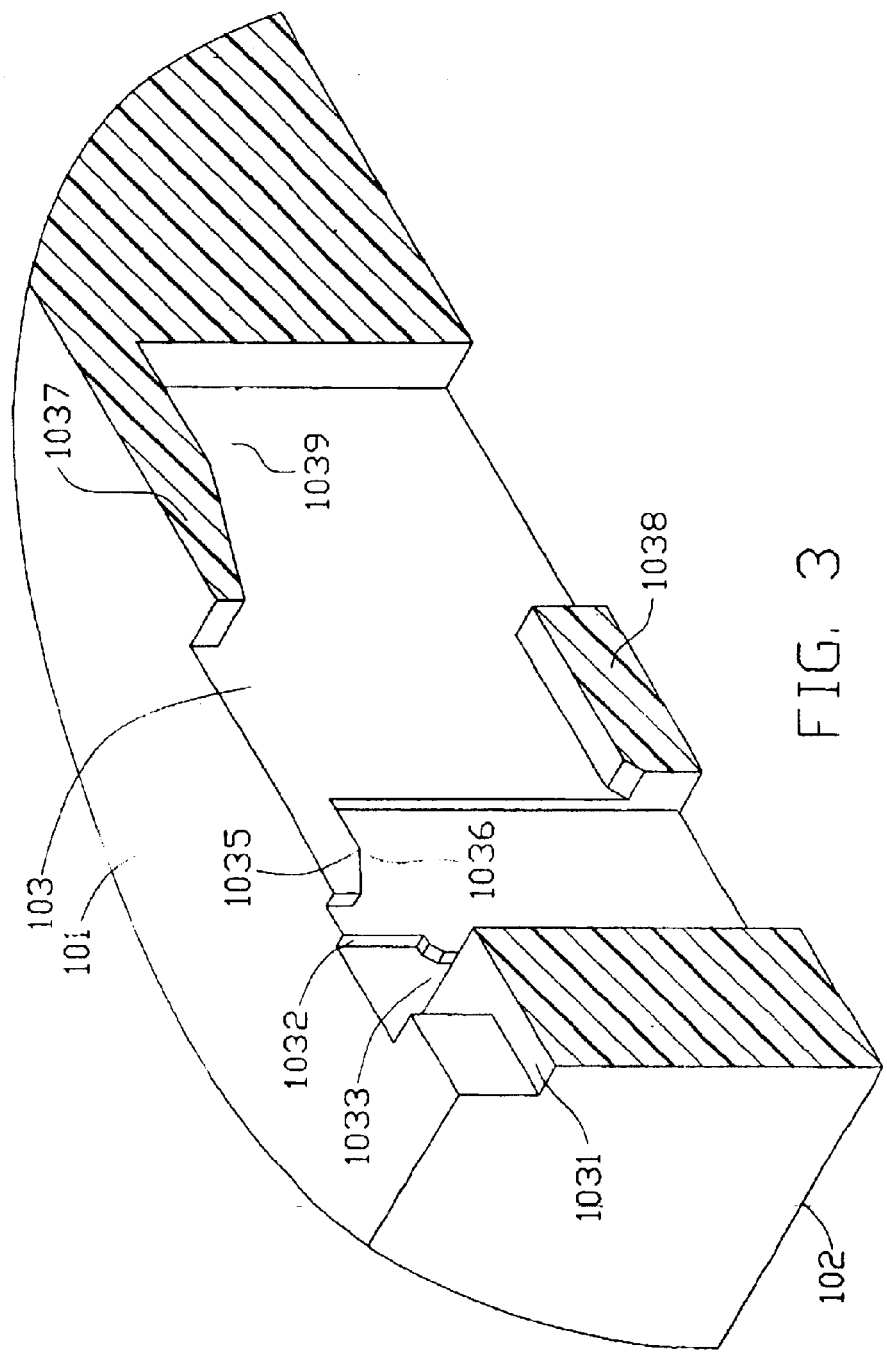
FIG. 3 is an enlarged, isometric cut-away view of part of an insulative housing of the electrical connector of FIG. 1, corresponding to line III—III thereof.

Reference will now be made to the drawing figures to describe the present invention in detail.

Referring to FIGS. 1~4, an electrical connector 1 of the present invention comprises an insulative housing 10 and a plurality of contacts 20 received in the housing 10. The housing 10 defines a first surface 101, an opposite second surface 102, and a plurality of passageways 103 communicating therebetween. The passageways 103 are arranged in two symmetrically opposite rows at opposite long sides of the housing 10 respectively. Each passageway 103 is symmetrically configured, and is bounded in part by a step 1031 and a pair of opposite protruding planes 1032, thereby defining a first receiving channel 1033 that comprises an interfering slot 1304. The passageway 103 is also bounded in part by a pair of blocking members 1035, thereby defining a second receiving channel 1036 generally below the blocking members 1035. In addition, the passageway 103 is bounded by an orientation block 1037 opposite from the step 1031 and a supporting body 1038 opposite from both the step 1031 and the orientation block 1037, thereby defining a third receiving channel 1039.

Each contact 20 comprises a supporting portion 201, a flexure portion 202 extending from one end of the supporting portion 201, a solder portion 203 extending from an opposite other end of the supporting portion 201, an interfering portion 204 vertically extending from the solder portion 203, and a tail portion 205 extending from the interfering portion 204. The contact 20 further comprises an elastic portion 206, which defines a first contacting portion 207 in an upper position and a second contacting portion 208 in a lower position. The first contacting portion 207 is displaced from the second contacting portion 208 in a direction that is perpendicular to the supporting portion 201.

Figure 4:
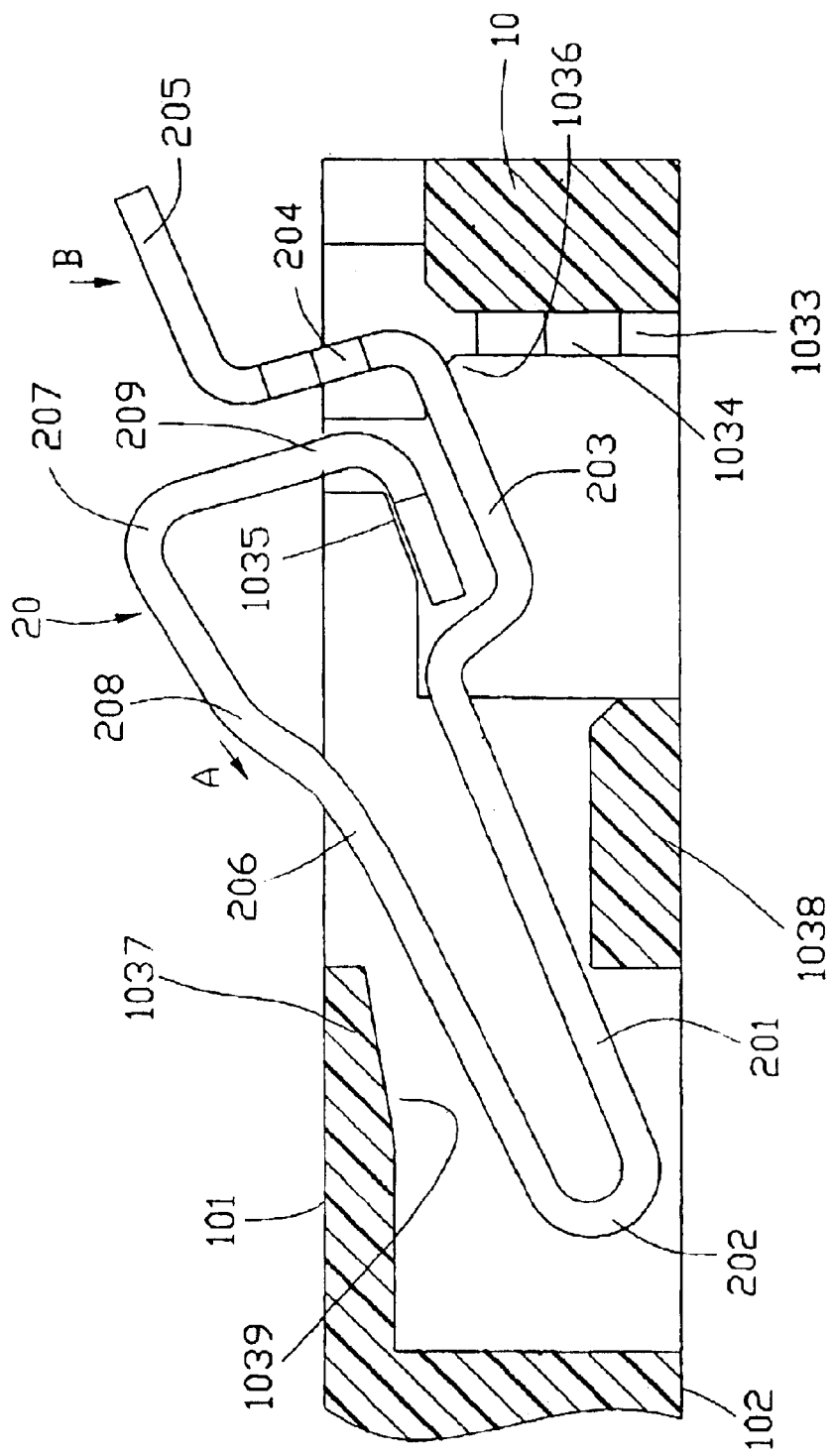
FIG. 4 is an enlarged, cross-sectional view of part of the housing of the electrical connector of FIG. 1, corresponding to line IV—IV thereof and showing a contact being installed into the housing.

Referring to FIG. 4, to install each contact 20 into its corresponding passageway 103, the contact 20 is inserted into the third channel 1039 along direction A. Then the tail portion 205 is pressed along direction B such that the supporting portion 201 is supported on the supporting body 1038, and the tail portion 205 is supported on the step 1031. In this process, the interfering portion 204 interferes with the housing 10 in the interfering slot 1034.

Figure 5:
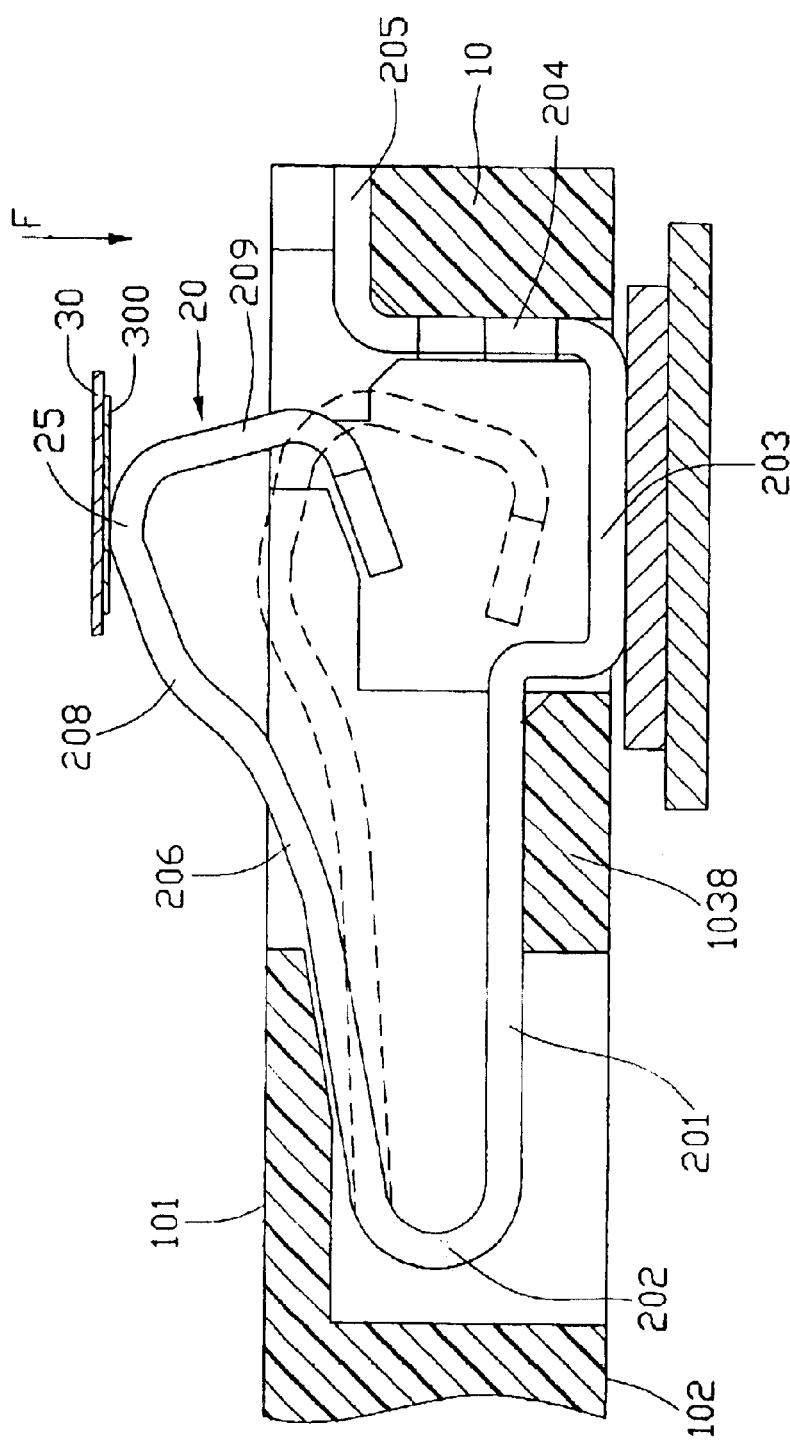
FIG. 5 is similar to FIG. 5, but showing the contact fully installed in the housing, and further showing the electrical connector connecting with an LGA electrical component and a PCB.

Referring to FIG. 5, the electrical component 30 mating with the electrical connector 1 defines a plurality of conductive pads 300 corresponding to the contacts 20. A width of each conductive pad 300 is greater than a distance between the first contacting portion 207 and the second contacting portion 208. When the electrical component 30 and the electrical connector 1 are mated, the conductive pad 300 connects with the contact 20 first, and then the electrical component 30 is actuated to move toward the housing 10 by force F. During this movement, the first contacting portion 207 of the contact 20 moves along the direction of movement of the conductive pad 300, and at the same time the first contacting portion 207 moves along an approximately arcuate path. Relative to the conductive pad 300, the first contacting portion 207 undergoes a displacement along a direction perpendicular to the direction of movement of the electrical component 30, and finally moves out of contact with the conductive pad 300. Before the first contacting portion 207 moves out of contact with the conductive pad 300, the second contacting portion 208 connects with the conductive pad 300, thus providing reliable electrical connection between the electrical component 30 and an associated PCB (not labeled). It is noted that in the embodiment the housing provides an abutment slanted surface (not labeled) in each passageway to abut against the joint portion between the elastic portion 206 and the flexure portion 202 so as to limit the upward movement of the elastic portion 206 after the electrical component 30 is removed from the connector. This preload arrangement of the contact facilitates the two spaced contacting points of the invention other than the mechanical configuration design of the elastic portion and the two contacting portions thereof.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. An electrical connector used for electrically connecting an electrical component having conductive pads to a printed circuit board comprising:

an insulative housing defining a first surface and an opposite second surface and a plurality of passageways communicating therebetween;

a plurality of contacts received in the passageways and each being corresponding to one conductive pad, each contact defining an elastic portion outwardly of the first surface, the elastic portion defining a first contacting portion and a second contacting portion, the elastic portion being movable between an upper position where the first contacting portion is adapted to contact one of the conductive pads and a lower position where the second contacting portion is adapted to contact said one of the conductive pads;

wherein a distance between the first contacting portion in the upper position and the second contacting portion in the lower position is shorter than a horizontal dimension of the conductive pad of the complementary electrical component;

wherein the contact comprises a supporting portion and a flexure portion extending from the support portion;

wherein the contact comprises a solder portion extending from the supporting portion and an interfering portion extending from a distal end of the solder portion;

wherein the contact having the elastic portion extending from the flexure portion along a lengthwise direction of the passageway, with spaced the first and second contacting portions at a free distal end of the elastic portion.

2. A contact used in an electrical connector for connecting an electrical component having conductive pads to a printed circuit board comprising: an elastic portion defining a first contacting portion in an upper position where the first contacting portion is adapted to contact with one of the conductive pads of the electrical component and a second contacting portion in a lower position where only the second contacting portion is adapted to contact with the same conductive pad of the electrical component and the first contacting portion is synchronously disable;

wherein a distance between the first contacting portion in the upper position and the second contacting portion in the lower portion is shorter than a horizontal dimensioning of the conductive pad of the complementary electrical component;

wherein the contact comprises a supporting portion and a flexure portion extending from the supporting portion;

wherein the first contacting portion is farther from the supporting portion than the second contacting portion;

wherein the first contacting portion is farther from the supporting portion;

wherein the contact having the elastic portion extending from the flexure portion along a lengthwise direction of a contact passageway, with spaced the first and second contacting portions at a free distal end of the elastic portion.

3. An electrical connector used for electrically connecting an LGA integrated circuit module having conductive pads to a PCB comprising:

an insulative housing defining a first surface and a second surface opposite to the first surface and pluralities of passageways communicating therebetween;

a plurality of contacts received in the passageways and each defining an elastic portion outwardly of the first surface, the elastic portion defining a first contacting portion and a second contacting portion, the elastic portion being movable between an upper position where the first contacting portion is adapted to contact one of the conductive pads and a lower position where the second contacting portion is adapted to contact said one of the conductive pads; wherein, a distance between the first contacting portion and the second contacting portion is shorter than a horizontal dimension of the conductive pad of the complementary electrical component;

wherein the contact comprises a supporting portion and a flexure portion extending from the supporting portion;

wherein the contact comprises a solder portion extending from the supporting portion and an interfering portion extending from a distal end of the solder portion;

wherein the contact having the elastic portion extending from the flexure portion along a lengthwise direction of the passageway, with spaced the first and second contacting portions at a free distal end of the elastic portion.

4. An electrical connector assembly comprising:

an insulative housing defining a top surface thereon and a plurality of passageways therein, the housing defining an abutment surface in each of said passageways;

a plurality of contacts received in the corresponding passageways, respectively, each of said contacts defining an elastic portion extending from a flexure portion, along a lengthwise direction of the passageway, with spaced first and second contacting portions at a free distal end of said elastic portion, said first contacting portion being spaced from the flexure portion farther than the second contacting portion; and an electronic component including a plurality of conductive pads on an undersurface thereon and located unto the top face; wherein the contact is received in the corresponding passageway in a preload manner when said electronic component is unloaded unto the housing, and said elastic portion and the first and the second contacting portions are all configured not only to initially have the first contacting portion engage the corresponding conductive pad but the second contacting portion not when said electronic component is initially moved toward the housing to slightly downwardly press the contact and the elastic portion just leaves the corresponding abutment surface in the corresponding passageway, but also to successively moved downwardly toward the housing to largely downwardly press the contact and said elastic portion is largely spaced from said corresponding abutment surface in the corresponding passageway.

* * * * *